US011812583B2

(12) United States Patent
Heckmann et al.

(10) Patent No.: US 11,812,583 B2
(45) Date of Patent: Nov. 7, 2023

(54) PASSIVE THERMAL-CONTROL SYSTEM OF A MESH NETWORK DEVICE AND ASSOCIATED MESH NETWORK DEVICES

(71) Applicant: Google LLC, Mountain View, CA (US)

(72) Inventors: Frédéric Heckmann, Taipei (TW); Ihab A. Ali, Cupertino, CA (US)

(73) Assignee: Google LLC, Mountain View, CA (US)

( * ) Notice: Subject to any disclaimer, the term of this patent is extended or adjusted under 35 U.S.C. 154(b) by 316 days.

(21) Appl. No.: 17/064,372

(22) Filed: Oct. 6, 2020

(65) Prior Publication Data

US 2022/0109222 A1 Apr. 7, 2022

(51) Int. Cl.
| | |
|---|---|
| *H05K 7/20* | (2006.01) |
| *F28F 21/08* | (2006.01) |
| *F28F 21/02* | (2006.01) |
| *F28D 21/00* | (2006.01) |

(52) U.S. Cl.
CPC ......... *H05K 7/20445* (2013.01); *F28F 21/02* (2013.01); *F28F 21/084* (2013.01); *H05K 7/20509* (2013.01); *F28D 2021/0029* (2013.01)

(58) Field of Classification Search
CPC . H05K 7/20445; H05K 7/20509; F28F 21/02; F28F 21/084; F28D 2021/0029
See application file for complete search history.

(56) References Cited

U.S. PATENT DOCUMENTS

| | | |
|---|---|---|
| 2010/0177482 A1 | 7/2010 | Spivey |
| 2015/0382448 A1 | 12/2015 | Pennathur et al. |
| 2017/0347172 A1 | 11/2017 | Kim et al. |
| 2018/0343403 A1 | 11/2018 | Mehdi et al. |
| 2018/0343772 A1* | 11/2018 | Raghupathy ........... G03B 17/55 |
| 2019/0021184 A1 | 1/2019 | Williams et al. |
| 2019/0045674 A1* | 2/2019 | Liang .................... H05K 1/181 |
| 2019/0104640 A1 | 4/2019 | Chang et al. |
| 2019/0200872 A1 | 7/2019 | Matsuoka et al. |
| 2019/0205655 A1 | 7/2019 | Matsuoka et al. |
| 2020/0196038 A1* | 6/2020 | Curtiss .................. H04R 9/022 |

(Continued)

FOREIGN PATENT DOCUMENTS

| | | |
|---|---|---|
| CN | 106462204 | 2/2017 |
| WO | 2016045120 | 3/2016 |

(Continued)

OTHER PUBLICATIONS

"Extended European Search Report", EP Application No. 20200820.7, dated Mar. 5, 2021, 10 pages.

(Continued)

*Primary Examiner* — Mukundbhai G Patel
(74) *Attorney, Agent, or Firm* — Colby Nipper PLLC (57) ABSTRACT

This document describes a passive thermal-control system that is integrated into a mesh network device. The passive thermal-control system, which may include a heat sink and multiple heat spreaders, is such that heat originating with integrated circuit devices of the mesh network device and a speaker module of the mesh network device may be transferred to other components of the mesh network device, such as a housing component of the mesh network device. The heat may then be dissipated to an external environment to maintain a desired thermal profile of the mesh network device.

20 Claims, 8 Drawing Sheets

(56) References Cited

U.S. PATENT DOCUMENTS

2021/0111095 A1  4/2021  Ali et al.
2023/0139054 A1  5/2023  Ali et al.

FOREIGN PATENT DOCUMENTS

WO    2018125632    7/2018
WO    2021072096    4/2021

OTHER PUBLICATIONS

"Extended European Search Report", EP Application No. 20201375.1, dated Mar. 11, 2021, 6 pages.
"International Search Report and Written Opinion", Application No. PCT/US2020/054810, dated Jan. 29, 2021, 18 pages.
"International Preliminary Report on Patentability", Application No. PCT/US2020/054810, dated Apr. 12, 2022, 13 pages.
"Foreign Office Action", EP Application No. 20200820.7, dated Jan. 19, 2023, 4 pages.
"Foreign Office Action", CN Application No. 202011073776.8, dated Nov. 15, 2022, 19 pages.
"Foreign Office Action", CN Application No. 202011073776.8, dated May 13, 2023, 14 pages.

\* cited by examiner

PASSIVE THERMAL-CONTROL SYSTEM OF A MESH NETWORK DEVICE AND ASSOCIATED MESH NETWORK DEVICES

A mesh network is a network that includes multiple nodes that link together to improve network performance and network accessibility. As an example, a mesh network supporting a wireless local area network (WLAN) may include multiple wireless nodes linking together across an area. Each wireless node, or mesh network device, may provide wireless devices access to the WLAN and exchange network information with other mesh network devices. The aggregate functions of the multiple mesh network devices, in general, improve connectivity to the WLAN across the area and improve efficiency of data exchange.

In some instances, the mesh network device may be a range-extending mesh network device that includes a voice assistant. The mesh network device may be a small form-factor and include multiple electronic subsystems that generate heat. An example of an electronic subsystem is a printed circuit board (PCB) that is populated with a variety of integrated circuit (IC) devices. Another example of an electronic subsystem is a speaker module that may be used by the voice assistant.

To dissipate heat from the electronic subsystems and avoid degradation of the electronic subsystems, a thermal-control system may be used. However, an active thermal-control system, such as a thermal-control system that circulates a coolant or a liquid, may not be feasible due to form-factor and/or power consumption considerations.

SUMMARY

This document describes a passive thermal-control system that is integrated into a mesh network device. The passive thermal-control system, which may include a heat sink and multiple heat spreaders, is such that heat originating with IC devices populating a PCB of the mesh network device and a speaker module of the mesh network device may be transferred to other components of the mesh network device, such as a housing component of the mesh network device. The heat may then be dissipated to an external environment to maintain a desired thermal profile of the mesh network device.

In some aspects, an apparatus is described. The apparatus includes a PCB, a speaker module, and a passive thermal-control system. The passive thermal-control system is configured to dissipate heat generated by the speaker module and one or more integrated circuit (IC) components populating the PCB to an exterior environment surrounding the apparatus. The passive thermal-control system includes a heat sink that is generally cylindrical having an interior disk-like body that is in thermal contact with the one or more IC devices. The passive thermal-control system further includes a first planar heat spreader that is attached to a surface of the disk-like body and a second planar heat spreader that is attached to a surface of the speaker module.

In other aspects, an apparatus is described. The apparatus includes a heat sink that has a disk-like body extending radially from a central axis and defining a perimeter. The disk-like body has a first surface that is substantially orthogonal to the central axis and opposite the first surface. A planar heat spreader is attached to the first surface. The disk-like body also has a second surface that is substantially orthogonal to the central axis and opposite the first surface. One or more pedestal(s) are formed onto the second surface. The one or more pedestal(s) thermally contact one or more respective integrated circuit devices of the apparatus using one or more thermal interface materials.

The heat sink also includes one or more fin regions, each of which extends from a respective portion of the perimeter of the body in a direction that is substantially parallel to the central axis. Each of the one or more fin regions has an interior surface facing the central axis and an opposing exterior surface.

The details of one or more implementations are set forth in the accompanying drawings and the following description. Other features and advantages will be apparent from the description, the drawings, and the claims. This Summary is provided to introduce subject matter that is further described in the Detailed Description and Drawings. Accordingly, a reader should not consider the Summary to describe essential features nor limit the scope of the claimed subject matter.

BRIEF DESCRIPTION OF THE DRAWINGS

The details of one or more aspects of a passive thermal-control system for a mesh network device and associated mesh network devices are described below. The use of the same reference numbers in different instances in the description and the figures may indicate like elements.

DETAILED DESCRIPTION

This document describes a passive thermal-control system that is integrated into a mesh network device. The passive thermal-control system, which may include a heat sink and multiple heat spreaders, is structured such that heat originating from IC devices of the mesh network device and a speaker module of the mesh network device may be transferred to other components of the mesh network device, such as a housing component. The heat may then be dissipated to an external environment to maintain a desired thermal profile of the mesh network device.

Heat transfer, in general, is energy that is in transit due to a temperature difference. If one or more temperature differences exist across components of a system, such as the mesh network device, heat (e.g., energy in Joules (J)) will transfer from higher temperature zones to lower temperature zones to reduce the temperature differences. There are several mechanisms for heat transfer across the components of the system to reduce temperature differences, including convection, radiation, and conduction.

Convection, or heat transfer from a surface due to movement of molecules within fluids such as gases and liquids, may be quantified by equation (1) below:

$$q_{conv} = hA(T_s - T_\infty) \quad (1)$$

For equation (1), a $q_{conv}$ represents a rate of heat transfer from a surface through convection (e.g., in J per second or Watts (W)), h represents a convection heat-transfer coefficient (e.g., in W per meter squared (W/m$^2$)), $T_s$ represents a temperature of a surface (e.g., in Kelvin (K) or degrees Celsius (° C.)), and $T_\infty$ represents a temperature of a fluid (e.g., in K or ° C.) to which the surface is exposed. The term A represents an area of a surface (e.g., in m$^2$).

Radiation, or heat transfer from a surface through electromagnetic radiation, may be quantified by equation (2) below:

$$q_{rad} = \varepsilon A \sigma (T_s^4 - T_{surr}^4) \quad (2)$$

For equation (2), $q_{rad}$ represents a rate of heat transfer through radiation (e.g., in W), ε represents emissivity (dimensionless), σ represents the Stefen-Boltzmann constant (e.g., σ=5.67×10$^{-8}$ W/(m$^2$·K$^4$)), $T_s$ represents a temperature of a surface (e.g., in K or ° C.), and $T_{surr}$ represents a temperature of surroundings of the surface (e.g., in K or ° C.). The term A represents an area of the surface (e.g., in m$^2$).

Conduction, or heat transfer through a solid body through atomic and molecular activity, may be quantified by equation (3) below:

$$q_{cond} = -kA\frac{dT}{dx} \quad (3)$$

For equation (3), $q_{cond}$ represents a rate of heat transfer in a solid material through conduction (e.g., in W), k represents a thermal conductivity of the solid material (e.g., in W/(m·K)), and dT/dx represents a temperature gradient through the solid material (e.g., in K/m or ° C./m). The term A represents a cross-sectional area of the solid material (e.g., in m$^2$).

In instances of heat transfer from one physical body to another, through one or more of a convection heat-transfer mechanism, a radiation heat-transfer mechanism, or a conduction heat-transfer mechanism, the physical bodies may be in thermal contact. In some instances, this can include direct physical contact between the bodies or a material (e.g., a TIM) located between the bodies, enabling conduction-based heat transfer between the bodies. In other instances, this can include an air gap between the bodies that enables convection-based and/or radiation-based heat transfer between the bodies.

A mesh network device may include a passive thermal-control system that transfers heat using one or more of the heat-transfer mechanisms described above. In general, and in accordance with equations (1) and (2), rates and/or quantities of heat transfer can be varied by increasing or decreasing surface areas for convection and/or radiation within the mesh network device (e.g., increasing or decreasing surface areas of planar heat spreaders). In accordance with equation (3) and within the passive thermal-control system, rates and/or quantities of heat transfer can also be varied by introducing, between surfaces, one or more thermal interface materials (TIMs) that have a high thermal conductivity.

Through conduction, convection, and radiation heat-transfer mechanisms, as described and quantified by equations (1)-(3) above, the passive thermal-control system may transfer heat originating from heat-generating electronic devices within the mesh network device to an interior surface of a housing component of the mesh network device. An exterior surface of the housing component may then dissipate the heat to an external environment through convection and/or radiation, effective to prevent degradation of the electronic subsystems that may include the heat-generating electronic devices.

While features and concepts of the described passive thermal-control system can be implemented in any number of different environments, apparatuses, and/or various configurations, aspects are described in the context of the following examples.

Figure 1:
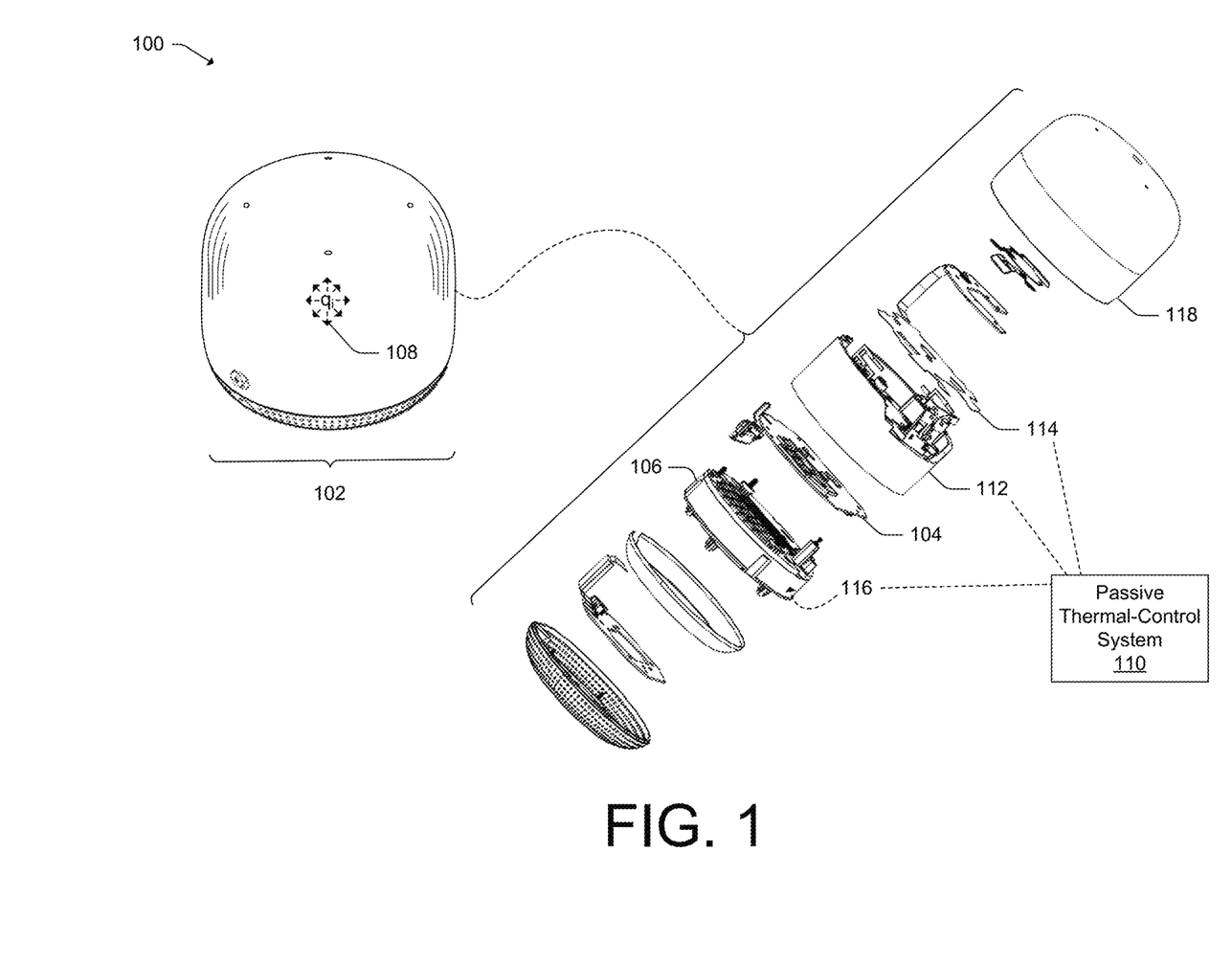
FIG. 1 illustrates an example operating environment including a mesh network device having a passive thermal-control system.

FIG. 1 illustrates an example operating environment 100 including a mesh network device 102. The mesh network device 102 includes multiple electronic devices, including a PCB 104 populated with one or more IC devices. The mesh network device 102 also includes a speaker module 106.

The mesh network device 102 may serve as a node of a wireless mesh network (e.g., a WLAN network conforming to IEEE 802.11 communication protocols (Wi-Fi)). In general, the mesh network device 102 may wirelessly couple other wireless devices (e.g., a wireless phone, a laptop computer) to the wireless mesh network.

The mesh network device 102 may, in some instances, include a voice-assistant to receive audible inputs from a user of the mesh network device 102. For example, the mesh network device 102 may receive, through the speaker module 106 and from a user of the mesh network device 102, a vocal command that the mesh network device 102 transmits to one or more applications available through the wireless mesh network (e.g., available from a cloud-computing environment or available through another device to which the mesh network device 102 is wirelessly coupled). As an example, the vocal command may be transmitted to a remote application supporting a home automation or security system.

As another example, the mesh network device 102 may receive, through the speaker module and from the user of the mesh network device 102, a vocal query. The mesh network device 102 may transmit the vocal query to one or more other applications available through the wireless mesh network (e.g., available from a cloud-computing environment or available through another device to which the mesh network device 102 is wirelessly coupled). In some instances, the vocal query may direct a search to be performed by a search engine available through the wireless mesh network. In other instances, the vocal query may direct media to be streamed through the speaker module 106 of the mesh network device 102 (e.g., play music through the mesh network device 102).

In general, and while performing operations (e.g., wirelessly coupling the other devices, receiving vocal commands, receiving vocal queries, playing media), the one or more IC devices populated on the PCB 104 and the speaker module 106 may generate an internal heat load 108 within the mesh network device 102. To manage the internal heat load 108 within the mesh network device 102 (e.g., prevent thermal runaway or damage to electronic systems of the mesh network device 102), a passive thermal-control system 110 may be used.

The passive thermal-control system 110 may include multiple elements, including a heat sink 112, a heat-sink heat spreader 114, and a speaker-module heat spreader 116 (not visible in FIG. 1). In some instances, the passive thermal-control system 110 may also include multiple thermal interface materials (TIMs).

The heat sink 112 may be generally cylindrical in shape, die-cast from a metal material (e.g., an aluminum material, a magnesium material). The heat-sink heat spreader 114 and the speaker-module heat spreader 116 each may be generally elliptical (or generally circular) in shape. The heat-sink heat spreader 114 and the speaker-module heat spreader 116 each may also be generally planar, formed from respective sheets of a graphite material.

The elements of the passive thermal-control system 110 (e.g., the heat sink 112, the heat-sink heat spreader 114, the speaker-module heat spreader 116) conduct, spread, and transfer the internal heat load 108 (e.g., a rate of heat transfer qi in Watts) to a housing component 118 of the mesh network device 102 or to a base 120 of the mesh network device. The housing component(s) 118 may then dissipate the internal heat load 108 (e.g., using a thermal-convection heat-transfer mechanism and/or a thermal-radiation heat-transfer mechanism) to an external environment. In some instances, and depending on configurations of the passive thermal-control system 110, portions of the internal heat load 108 transferred to the housing component(s) 118 may vary.

The passive thermal-control system 110 further maintains a desired thermal profile of the mesh network device 102. As an example, the conduction, spreading, and transfer of the internal heat load 108 by the passive thermal-control system 110 may maintain a surface temperature of the housing component(s) 118 at or below a temperature of approximately 67° Celsius (° C.) while the mesh network device 102 is operating in ambient conditions of 25° C. The passive thermal-control system 110 may also maintain junction temperatures of the IC devices populating the PCB 104 at or below different respective temperature thresholds.

Figure 2:
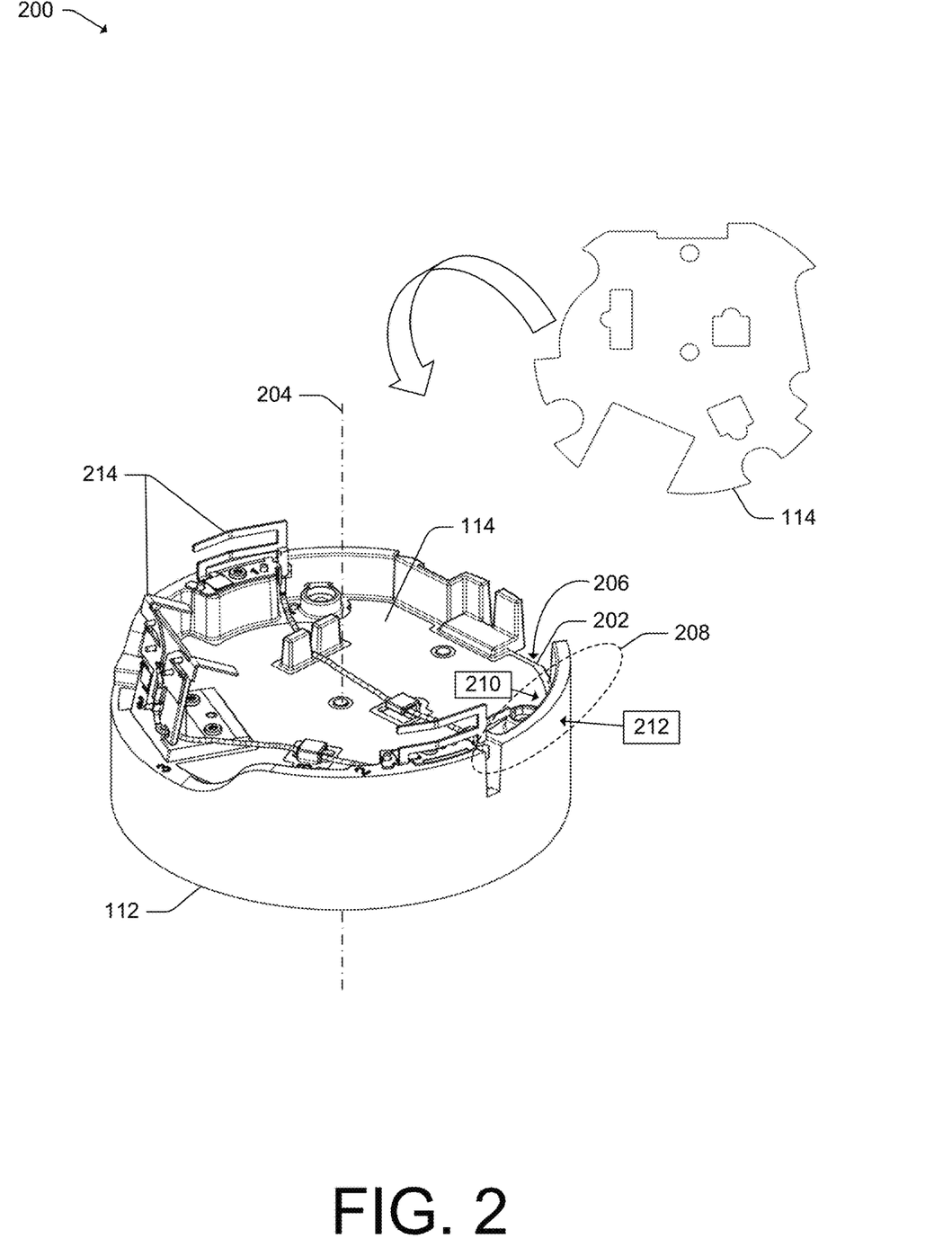
FIG. 2 illustrates a top isometric view of an example heat sink that may be included in a mesh network device.

FIG. 2 illustrates a top isometric view 200 of an example heat sink and an example heat-sink heat spreader (e.g., the heat sink 112 and the heat-sink heat spreader 114 of FIG. 1). As illustrated, the heat sink 112 includes a body 202 that is generally disk-like (e.g., middle region of the heat sink 112) extending radially from a central axis 204 to define a perimeter. The body 202 includes a first generally planar surface 206 (located under the heat-sink heat spreader 114 in FIG. 2) that is substantially orthogonal to the central axis 204. The heat-sink heat spreader 114 may attach to the first generally planar surface 206 (e.g., using a thermally conductive epoxy). Further, the heat-sink heat spreader 114 may be positioned coaxially with the heat sink 112, according to the central axis 204.

In some instances, the heat-sink heat spreader 114 may spread and transfer heat to the body 202 using a thermal-conduction heat-transfer mechanism. In other instances, the heat-sink heat spreader 114 may spread and transfer heat to a surrounding environment (e.g., a cavity within the mesh network device 102 of FIG. 1) using a thermal-convection heat-transfer mechanism and/or a thermal-radiation heat-transfer mechanism. For example, the heat-sink heat spreader 114 may spread and transfer heat in a generally outward direction away from the first generally planar surface 206 of the body 202 of the heat sink 112.

The heat-sink heat spreader 114 may include one or more sheets (e.g., layers) of a thermally conductive material such as a graphite material. Furthermore, different types of materials may be selected to increase or decrease emissivity ($\epsilon$) and alter thermal radiation characteristics of the heat-sink heat spreader 114.

The heat sink 112 may include one or more fin region(s) 208. Each fin region 208 may extend from the perimeter of the body 202 in one or more directions that are substantially parallel to the central axis 204. Furthermore, each fin region 208 may include an interior surface 210 and an opposing exterior surface 212. In some instances, each fin region 208 may transfer heat to a surrounding environment (e.g., to a cavity within the mesh network device 102 of FIG. 1 or to the housing component(s) 118 of the mesh network device of FIG. 1) using one or more of a thermal conduction, a thermal convection, and/or a thermal-radiation heat-transfer mechanism. The heat sink 112 may also include mounts, stands, or other fixturing mechanisms for one or more antenna(s) 214 that support wireless communications.

Figure 3:
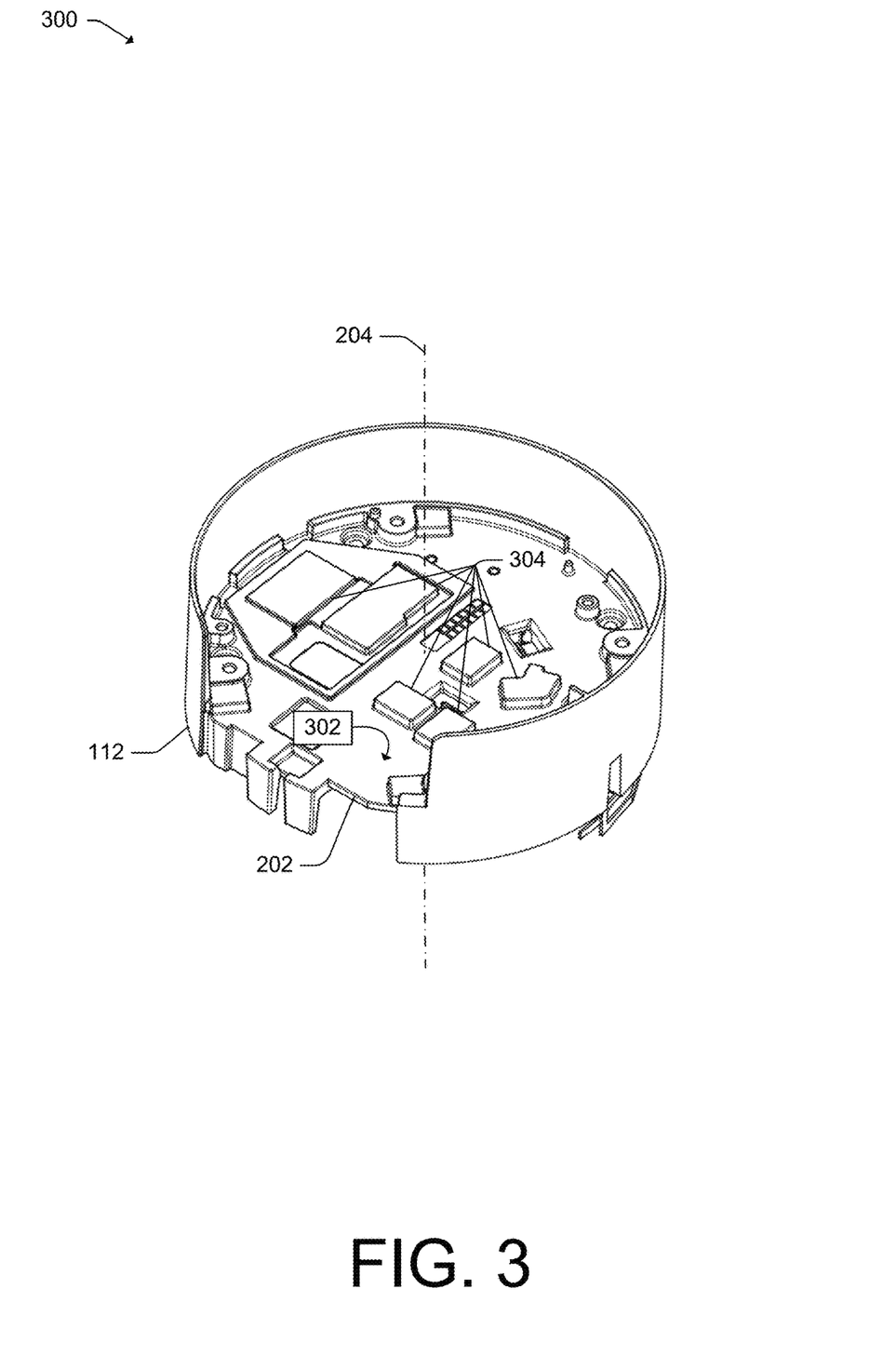
FIG. 3 illustrates a bottom isometric view of an example heat sink that may be included in a mesh network device.

FIG. 3 illustrates a bottom isometric view 300 of an example heat sink (e.g., the heat sink 112 of FIG. 1). As illustrated, the body 202 of the heat sink 112 includes a second generally planar surface (e.g., second generally planar surface 302 that is opposite the first generally planar surface 206 of FIG. 1). The second generally planar surface 302 may be generally orthogonal to the central axis 204. Furthermore, the second generally planar surface may face a speaker module (e.g., the speaker module 106).

As illustrated, the body 202 includes one or more pedestal(s) 304 that protrude from the second generally planar surface 302. Each pedestal 304 may interface with a thermal interface material (TIM) and enable the TIM to make physical (and thermally conductive) contact with a respective, heat-generating device (e.g., an IC device that may be part of the PCB 104 of FIG. 1). The TIM may effectuate thermal coupling between the heat-generating device and the pedestal 304. The pedestal 304 may, in turn, and using a thermal-conduction heat-transfer mechanism, transfer heat to the body 202 of the heat sink 112.

Examples of TIMs include gel materials and/or grease materials that may be thermally conductive. These materials may be injected with nano-particles, such as magnesium or aluminum nano-particles, to improve thermal conduction properties. Furthermore, TIMs located between the heat-generating devices and the one or more pedestal(s) 304 may reduce gaps and/or bond line gaps and improve thermal conduction efficiencies. Other examples of TIMs include thermally conductive foam materials and thermally conductive pad materials.

Figure 4:
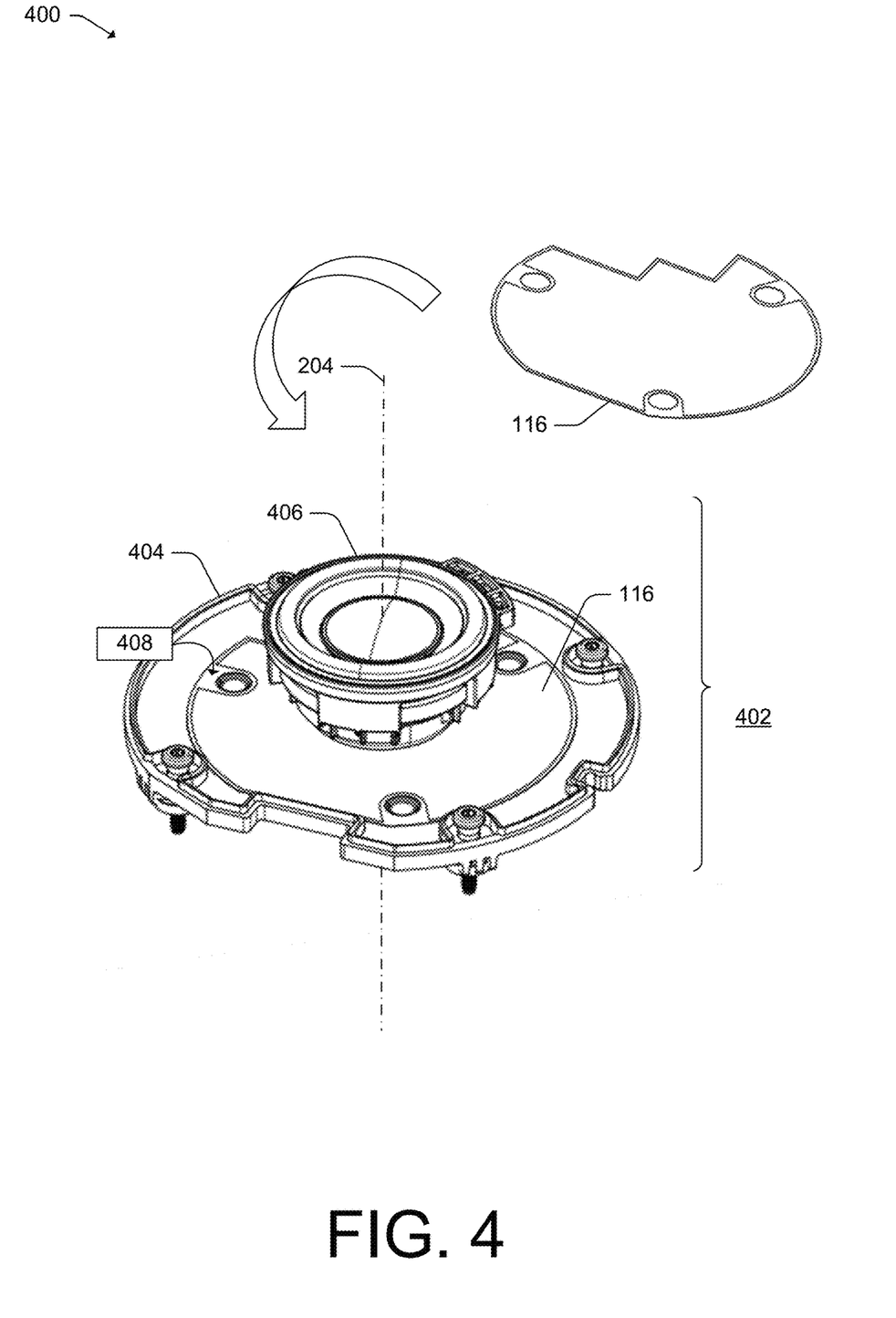
FIG. 4 illustrates a top isometric view of an example speaker-module subassembly that may be included in a mesh network device.

FIG. 4 illustrates a top isometric view 400 of an example speaker-module subassembly 402 that may be included in a mesh network device (e.g., the speaker-module subassembly 402 may be part of the speaker module 106 of the mesh network device 102 of FIG. 1). As illustrated, the speaker-module subassembly 402 includes a base 404 and a speaker-module driver 406. The base 404 includes an interior surface 408 that is generally planar and substantially orthogonal to the central axis 204. In some instances, the interior surface 408 may face a second surface of a heat sink (e.g., the second generally planar surface 302).

As illustrated, a heat spreader (e.g., the speaker-module heat spreader 116 of FIG. 1) attaches to the interior surface 408 of the base 404. For example, the speaker-module heat spreader 116 may attach to the interior surface 408 using a thermally conductive epoxy. In some instances, the interior surface 408 may face a surface of a heat sink (e.g., the second generally planar surface 302 of FIG. 2).

In some instances, the speaker-module heat spreader 116 may be located between the interior surface 408 and a magnet of the speaker-module driver 406. The speaker-module heat spreader 116 may use a thermal-conduction heat-transfer mechanism to transfer heat from the speaker-module driver 406 to the base 404. In some instances, the base 404 may use thermal conduction and/or thermal convection heat-transfer mechanisms to transfer the heat to a surrounding environment.

The speaker-module heat spreader 116 may include one or more sheets (e.g., layers) of a thermally conductive material such as a graphite material. Furthermore, different types of materials may be selected to increase or decrease emissivity (ξ) and alter thermal radiation characteristics of the speaker-module heat spreader 116.

Figure 5:
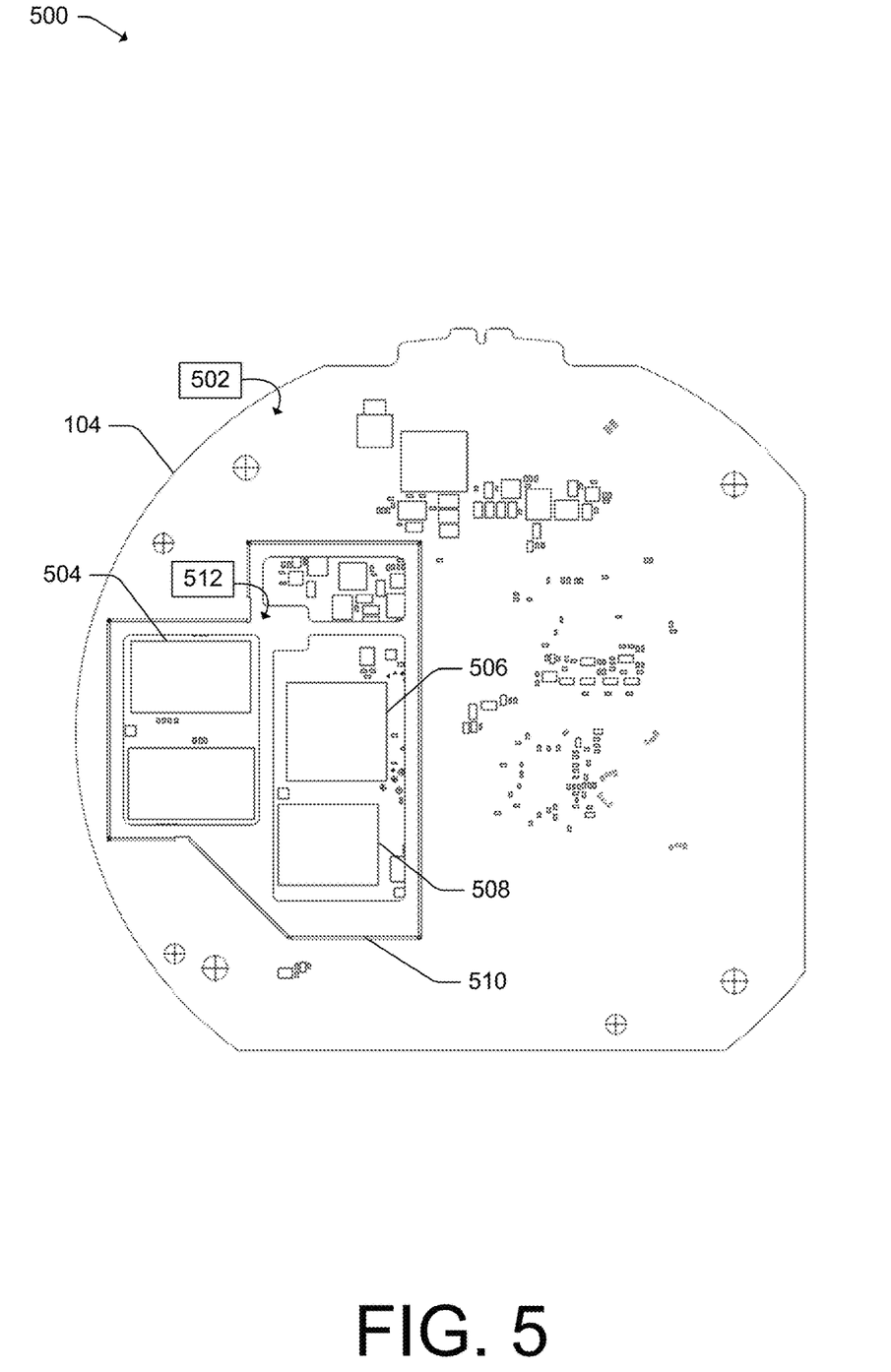
FIG. 5 illustrates a top plan view of an example PCB that may be included in a mesh network device.

FIG. 5 illustrates a top plan view 500 of an example PCB that may be included in a mesh network device (e.g., the PCB 104 of the mesh network device 102 of FIG. 1). The PCB 104 may be a multi-layer PCB that includes a glass-reinforced epoxy laminate material (e.g., FR-4) and multiple layers of electrically conductive traces. The PCB 104 may also be a "double-sided" PCB, where different IC devices may be mounted to opposing surfaces of the PCB 104 using surface-mount (SMT) soldering techniques. In some instances, traces within the multiple layers of the PCB 104 may include a thermally conductive material. For example, traces within the multiple layers of the PCB 104 may include a copper material. The PCB 104 may also include one or more ground planes (e.g., copper ground planes) that may each absorb, spread, and transfer heat within the PCB 104.

A first surface of the PCB 104 (e.g., a first surface 502) may be populated with a first set of IC devices. The first set of IC devices may include, for example, one or more memory IC devices 504, such as double-data rate dynamic random access memory (DDR DRAM) devices. The first set of IC devices may also include a system-on-chip (SoC) IC device 506 or an embedded multimedia card (eMMC) IC device 508.

Each IC device may electrically connect to the PCB 104 using solder connections that result from surface-mount (SMT) manufacturing techniques. In general, the first set of IC devices populating the first surface 502 of the PCB 104, when operating, may contribute to a heat load (e.g., the internal heat load 108 of FIG. 1) within a mesh network device (e.g., the mesh network device 102 of FIG. 1). In some instances, an electromagnetic interference (EMI) shield 510 may surround one or more planar regions 512 of the first surface 502 containing one or more the first set of IC devices.

Figure 6:
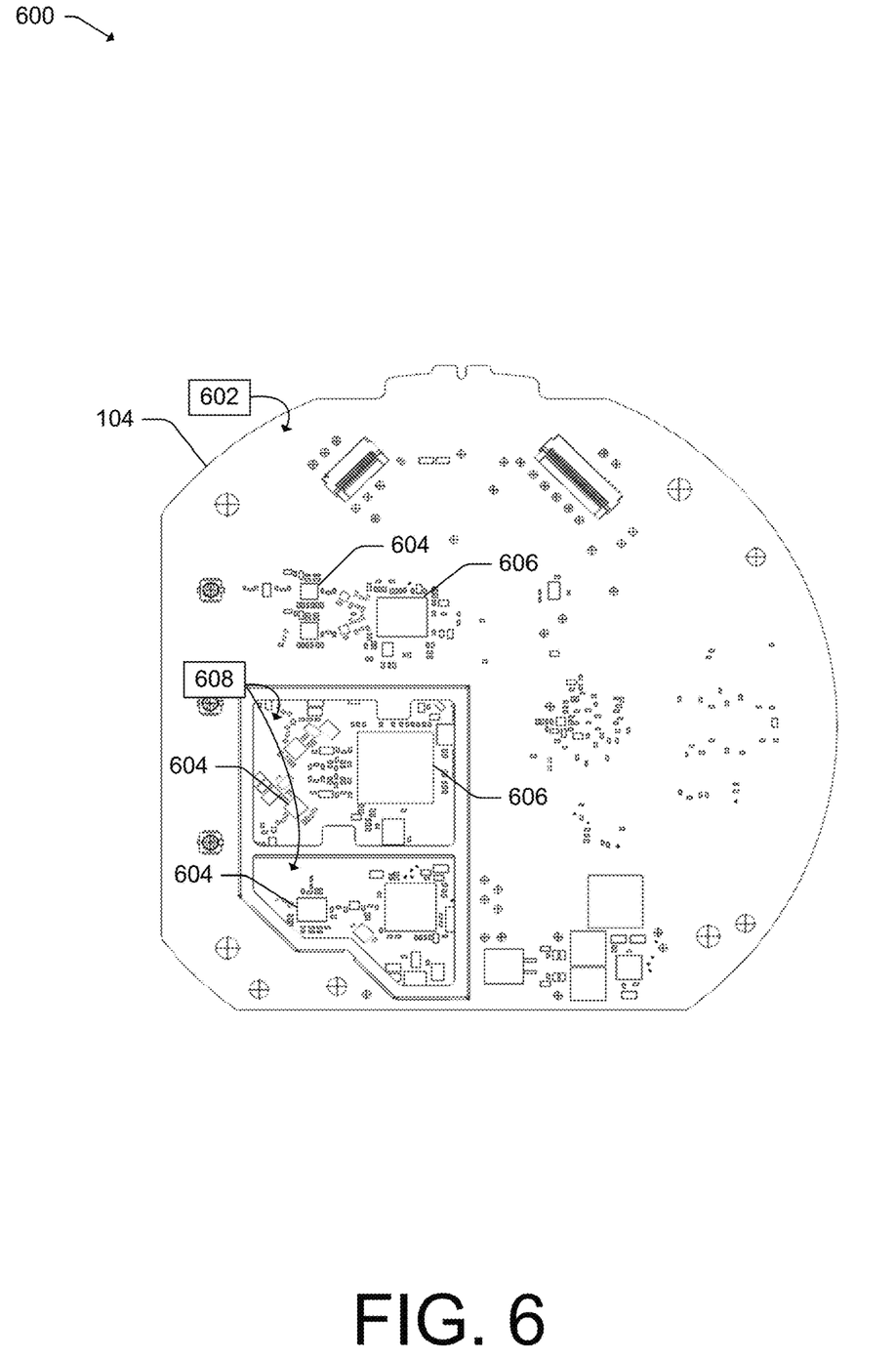
FIG. 6 illustrates a bottom plan view of an example PCB that may be included in a mesh network device.

FIG. 6 illustrates a bottom plan view 600 of an example PCB that may be included in a mesh network device (e.g., the PCB 104 of the mesh network device 102 of FIG. 1). A second surface of the PCB 104 (e.g., a second surface 602 that is opposite the first surface 502 of FIG. 5) may be populated with a second set of IC devices. The second set of IC devices may include, for example, one or more front end module (FEM) IC devices 604 (e.g., 2.4 Gigahertz (GHz) FEM, 5 GHz FEM, Thread FEM) and one or more radio frequency (RF) IC devices 606 (e.g., 2.4 GHz RF, 5 GHz RF) that may be associated with wireless communications of a wireless local area network (WLAN).

In general, the second set of IC devices populating the second surface 602 of the PCB 104, when operating, may contribute to a heat load (e.g., the internal heat load 108 of FIG. 1) within a mesh network device (e.g., the mesh network device 102 of FIG. 1). In some instances, another electromagnetic interference (EMI) shield may surround one or more planar regions 608 of the second surface 602 containing or more of the second set of IC devices.

Figure 7:
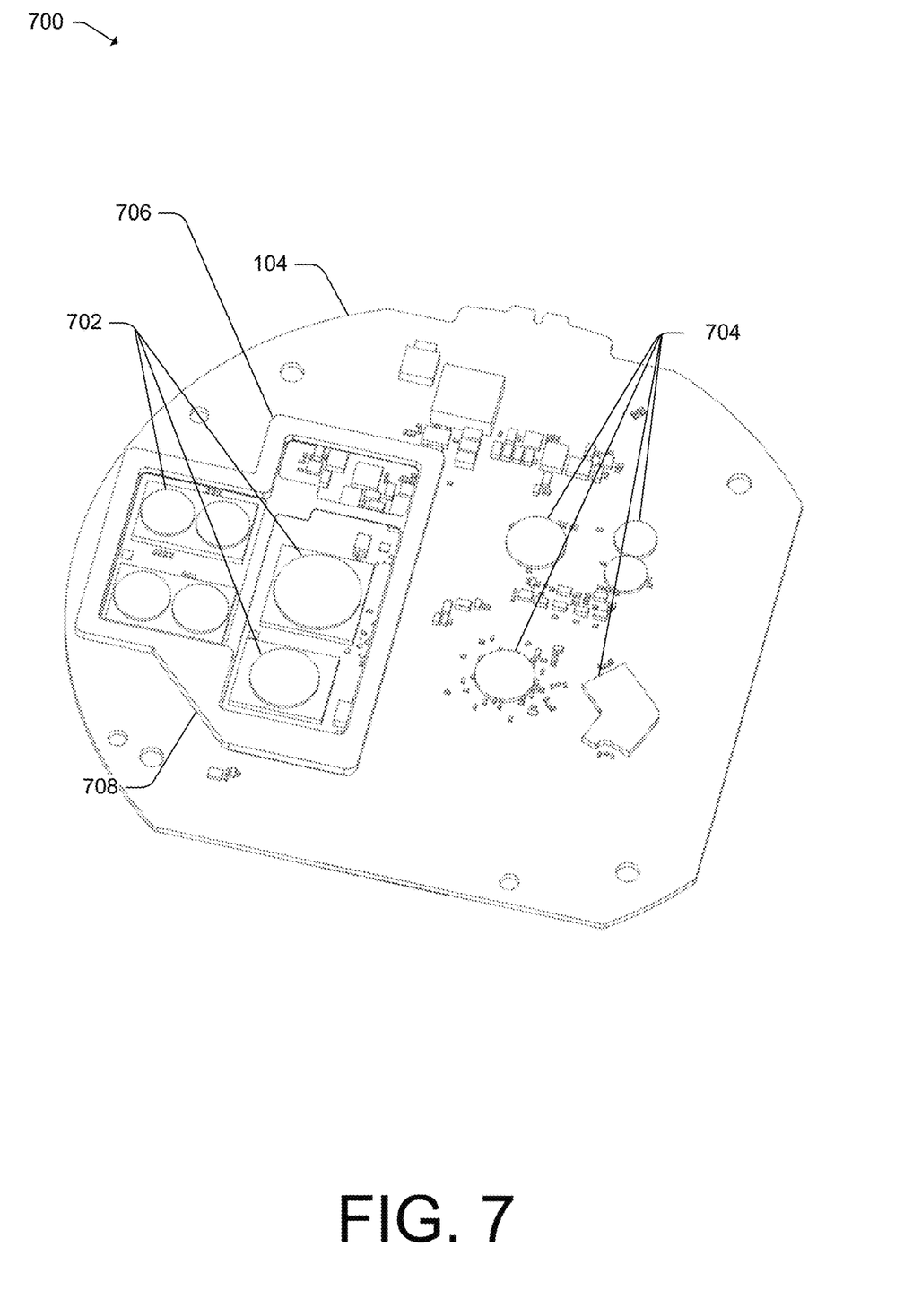
FIG. 7 illustrates an isometric view of example arrangements of thermal interface materials (TIMs) that may be included in a mesh network device.

FIG. 7 illustrates a top isometric view 700 of an example arrangement of TIMs that may be included in a mesh network device. The TIMs, as arranged, may transfer heat from IC devices populating the PCB 104 to a heat sink (e.g., the heat sink 112 of FIG. 1).

A first set of TIMs 702 may thermally couple a first set of IC devices populating a first surface of the PCB 104 (e.g., the one or more memory IC devices 504, the SoC IC device 506, and the eMMC IC device 508 populating the first surface 502 of FIG. 5) to respective pedestals that are part of the heat sink (e.g., a subset of the one or more pedestal(s) 304 of FIG. 3). The first set of TIMs 702 may be in directed thermal contact with the first set of IC devices.

In general, the first set of TIMs 702 may be positioned between the first set of IC devices and respective pedestals that are part of the heat sink. Furthermore, the first set of TIMs 702 may use a thermal-conduction heat-transfer mechanism to transfer heat from the first set of IC devices to the heat sink. In some instances, an EMI shield 708 may surround the first set of IC devices. In such instances, a thermally conductive foam may be located between the EMI shield 708 and the heat sink.

A second set of TIMs 704 may thermally couple, indirectly, a second set of IC devices, populating a second surface of the PCB 104 (e.g., the one or more FEM IC devices 604, and the one or more RF IC devices 606, populating the second surface 602 of FIG. 6), to other respective pedestals that are part of the heat sink (e.g., another subset of the one or more pedestal(s) 304 of FIG. 3). In this instance, and as opposed to being in direct physical contact with the second set of IC devices, the second set of TIMs 704 may be in direct physical contact with the surface of the PCB 104 (e.g., the first surface 502 of FIG. 5), which is opposite from the surface to which the other IC devices are mounted (e.g., the second surface 602 of FIG. 6) and proximate (e.g., located coaxially, respectively) to the second set of IC devices.

In general, the second set of TIMs 704 may be positioned between the surface of the PCB 104 and the other respective pedestals that are part of the heat sink, proximate to multiple other IC devices. Furthermore, the second set of TIMs 704 may use a thermal-conduction heat-transfer mechanism to transfer heat from the multiple other IC devices to the heat sink.

Figure 8:
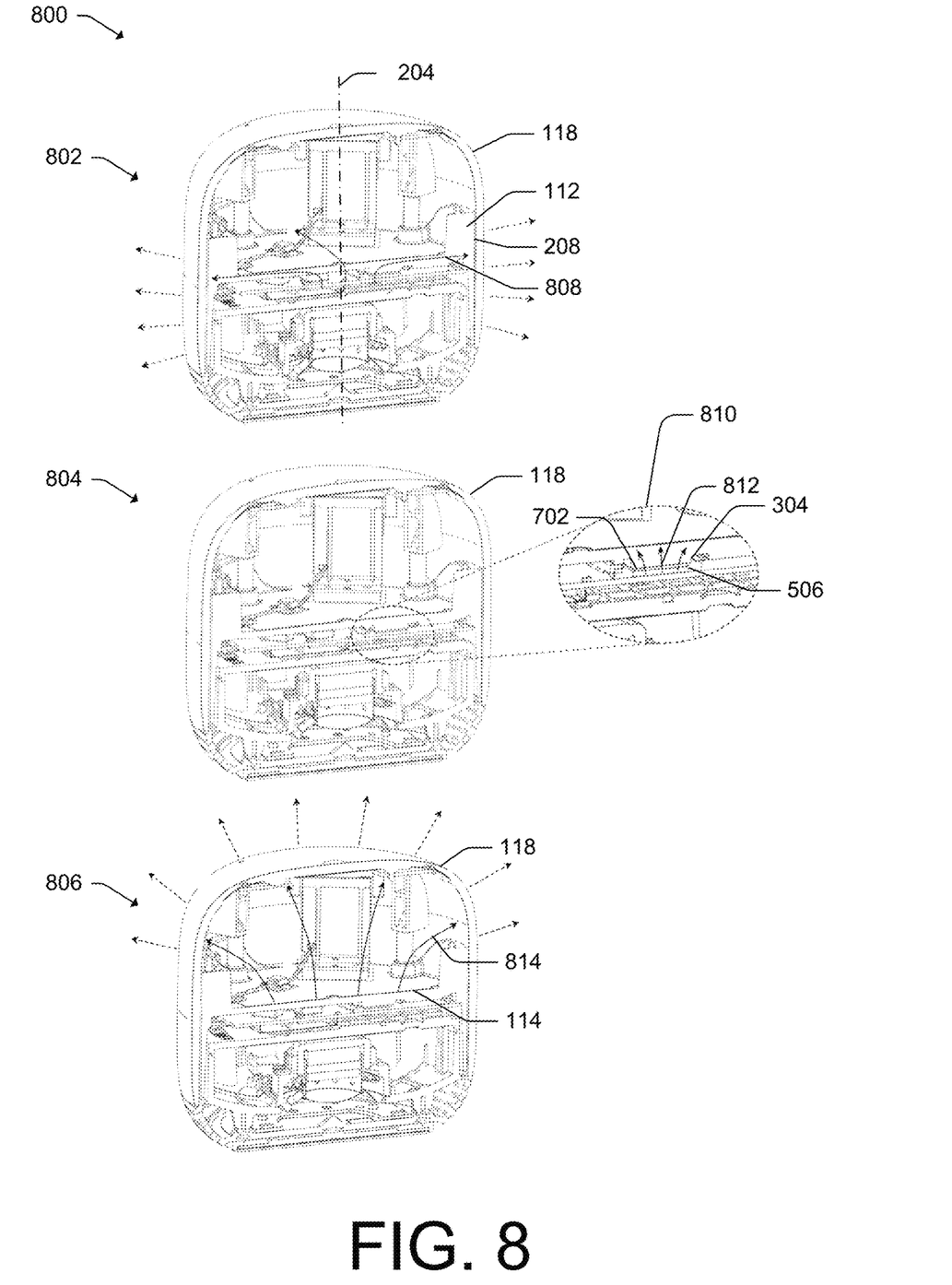
FIG. 8 illustrates details of example heat flow paths within an example mesh network device.

FIG. 8 illustrates example details 800 of heat-transfer paths within the example mesh network device 102. The example details 800 include several instances of a sectional view of the mesh network device 102, including instances 802, 804, and 806. The top illustration of FIG. 8 illustrates a first heat-transfer path 808 that transfers heat (e.g., a portion of the internal heat load 108 originating from multiple IC devices populating the PCB 104 and/or the speaker module 106 of FIG. 1) through the heat sink 112. The heat sink 112 may then, using convection, conduction, and/or radiation heat-transfer mechanisms, transfer the heat through the one or more fin regions 208 to the housing component 118 in a direction that is generally orthogonal to the central axis 204 of the heat sink 112. The housing component 118 may then, using convection and/or radiation heat-transfer mechanisms, transfer heat received through the first heat-transfer path 802 to the surrounding environment.

The middle illustration of FIG. 8 illustrates an enlarged view 810 of the second instance 804 within the example mesh network device 102. As illustrated, the second instance includes a second heat transfer path 812. As part of the second heat transfer path 812, a TIM of the first set of TIM(s) 702 uses thermal conduction to transfer heat from the SoC IC device 506 to one of the one or more pedestal(s) 304 (e.g., a corresponding respective pedestal of the one or more pedestal(s) 304). Heat transferred through the second heat-transfer path 812 may "join" with heat of the first heat-transfer path 808 to be transferred through the housing component 118 to the surrounding environment.

The bottom illustration of FIG. 8 illustrates a third instance 806. The third instance 806 includes a third heat-transfer path 814 that may use convection and/or radiation heat-transfer mechanisms to transfer heat (e.g., another portion of the internal heat load 108 originating from multiple IC devices populating the PCB 104 and/or the speaker module 106 of FIG. 1) to the housing component 118. Then, the housing component 118 may, using convection and/or radiation heat-transfer mechanisms, transfer heat received through the third heat-transfer path 814 to the surrounding environment.

Although techniques using and apparatuses for a passive thermal-control system of a mesh network device and associated mesh network devices are described, it is to be understood that the subject of the appended claims is not necessarily limited to the specific features or methods described. Rather, the specific features and methods are disclosed as example ways in which a thermal-control system of a mesh network device and associated mesh network devices can be implemented.

What is claimed is:

1. An apparatus comprising:
   an outer housing component that defines an internal cavity, the outer housing component having a central axis;
   one or more integrated circuit devices disposed within the internal cavity;
   a speaker module, the speaker module disposed at least partially within the internal cavity; and
   a passive thermal-control system that is configured to transfer heat generated by the speaker module and by the one or more integrated circuit devices to the outer housing component of the apparatus for external dissipation, the passive thermal-control system comprising:
   a heat sink, the heat sink including a body that has opposing first and second surfaces that are substantially orthogonal to the central axis, the heat sink being thermally coupled to at least one of the one or more integrated circuit devices via the second surface of the body, the heat sink comprising one or more fin regions that extend from a perimeter of the body of the heat sink in one or more directions that are substantially parallel to the central axis, each of the one or more fin regions contacts an inner surface of the outer housing component;
   a first heat spreader, the first heat spreader being generally planar and attached to the first surface of the body of the heat sink, the first heat spreader configured to receive heat from the one or more integrated circuit devices via the heat sink, the generally planar shape of the first heat spreader effective to cause a transfer of heat in a direction radially away from the first surface of the body of the heat sink to the outer housing component, the transfer of heat from the first heat spreader to the outer housing component caused by at least one of a convection heat-transfer mechanisms or a radiation heat-transfer mechanism due to a space within the internal cavity between the outer housing component and the first heat spreader; and
   a second heat spreader, the second heat spreader being generally planar and attached to a surface of the speaker module that is substantially orthogonal to the central axis.

2. The apparatus of claim 1, further comprising a thermally conductive foam material that thermally couples an electromagnetic interference shield surrounding the one or more integrated circuit devices to the heat sink.

3. The apparatus of claim 2, wherein the heat sink comprises a die-cast aluminum material or a magnesium material.

4. The apparatus of claim 2, wherein the first heat spreader or the second heat spreader includes a graphite material.

5. The apparatus of claim 1, wherein the second surface of the body of the heat sink faces a printed circuit board to which the one or more integrated circuit devices are mounted.

6. The apparatus of claim 1, wherein the second heat spreader is located between an interior surface of a base of the speaker module and a magnet of a speaker driver.

7. The apparatus of claim 1, wherein one or more respective thermal interface materials located between the one or more integrated circuit devices and the heat sink thermally couple the one or more integrated circuit devices to the heat sink.

8. The apparatus of claim 7, wherein the thermal interface materials are injected with nano-particles to improve thermal conduction properties.

9. The apparatus of claim 1, wherein the heat sink further comprises:
   one or more pedestals extending from the second surface; and
   one or more fin regions, each of the one or more fin regions:
     extending from a respective portion of the perimeter of the body of the heat sink in a direction that is substantially parallel to the central axis; and
     having an interior surface and an opposing exterior surface, the interior surface facing toward the central axis.

10. The apparatus of claim 9, further including a first thermal interface material that is located between a first pedestal of the one or more pedestals and a system-on-chip integrated circuit device.

11. The apparatus of claim 10, further including a second thermal interface material that is located between a second pedestal of the one or more pedestals and a memory integrated circuit device.

12. The apparatus of claim 11, wherein the system-on-chip integrated circuit device and the memory integrated circuit device:
    are mounted to a printed circuit board; and
    occupy a region of the printed circuit board that is generally planar and surrounded by an electromagnetic interference shield.

13. The apparatus of claim 12, further including a thermally conductive foam material located between the electromagnetic interference shield and the body.

14. The apparatus of claim 13, wherein the printed circuit board is located between the body of the heat sink and the speaker module of the apparatus.

15. The apparatus of claim 9, wherein the heat sink includes a mount that attaches an antenna to the heat sink.

16. The apparatus of claim 1, wherein the heat sink is generally cylindrical and centered about the central axis.

17. The apparatus of claim 1, wherein body of the heat sink is approximately disk-like.

18. The apparatus of claim 1, wherein the apparatus is a mesh network device configured to extend a wireless local area network.

19. The apparatus of claim 18, wherein:
the one or more integrated circuit devices comprise a microphone; and
the mesh network device is configured to:
  receive a vocal query from a user via the microphone;
  transmit the vocal query to an intelligent virtual assistant service available through the wireless local area network;
  receive a response via the intelligent virtual assistant service; and
  output an audio message based on the received response.

20. The apparatus of claim 1, wherein the transfer of heat from the first heat spreader to the outer housing component is effective to maintain a constant thermal profile of an external surface of the outer housing component due to the at least one of the convection heat-transfer mechanism or the radiation heat-transfer mechanism.

\* \* \* \* \*